United States Patent [19]

Kanai

[11] Patent Number: 5,696,004
[45] Date of Patent: Dec. 9, 1997

[54] METHOD OF PRODUCING SEMICONDUCTOR DEVICE WITH A BURIED LAYER

[75] Inventor: Nobuhiro Kanai, Yokohama, Japan

[73] Assignee: Nissan Motor Co., Ltd., Yokohama, Japan

[21] Appl. No.: 527,093

[22] Filed: Sep. 12, 1995

Related U.S. Application Data

[63] Continuation of Ser. No. 253,026, Jun. 2, 1994, abandoned.

[30] Foreign Application Priority Data

Jun. 2, 1993 [JP] Japan ................................. 5-131891

[51] Int. Cl.⁶ ........................................... H01L 21/266
[52] U.S. Cl. ..................... 437/26; 437/31; 437/97; 437/95; 437/931; 117/96; 148/7; 148/18
[58] Field of Search ........................ 437/26, 95, 97, 437/98, 6, 31, 32, 931; 148/DIG. 7, DIG. 18; 117/96

[56] References Cited

U.S. PATENT DOCUMENTS

| | | |
|---|---|---|
| 3,759,760 | 9/1973 | Encinas ........................... 148/DIG. 7 |
| 3,847,677 | 11/1974 | Takeda et al. . |
| 3,928,091 | 12/1975 | Tachi et al. ..................... 148/DIG. 7 |
| 3,998,674 | 12/1976 | Cameron et al. ........................ 437/97 |
| 4,168,997 | 9/1979 | Compton ................................ 437/26 |
| 4,717,683 | 1/1988 | Parillo et al. ......................... 437/931 |
| 4,931,406 | 6/1990 | Tomioka ................................ 437/28 |

FOREIGN PATENT DOCUMENTS

| | | | |
|---|---|---|---|
| 2009525 | 11/1981 | Germany | 437/95 |
| 60-167419 | 8/1985 | Japan | 437/95 |
| 61-290735 | 12/1986 | Japan | 437/97 |
| 3-132039 | 6/1991 | Japan | 437/97 |
| 4-306839 | 10/1991 | Japan | 437/97 |

OTHER PUBLICATIONS

S. Wolf & R.N. Tauber, "Silicon Processing for the VLSI Era", vol. I, pp. 265–269, 282–283,319. 1986.

S. Wolf, "Silicon Processing for the VLSI Era", Vol. II, pp. 454, 534–543.

H.M. Demsky, et al., IBM Tech. Disclosure Bulletin vol. 13, No. 3, Aug. 1970, pp. 807–808 "Technique for Counteracting Epitaxial Autodoping".

Primary Examiner—Charles L. Bowers, Jr.
Assistant Examiner—Leon Radomsky
Attorney, Agent, or Firm—Lowe, Price, LeBlanc & Becker

[57] ABSTRACT

A method of producing a semiconductor device having a high concentration N-type buried layer on a P-type silicon substrate, the buried layer being covered with a P-type silicon epitaxial layer. The method comprises forming a P-type high concentration layer at a surface portion of the silicon substrate in a region in which no N-type buried layer is to be formed, thereby preventing an inversion layer from being formed at the boundary between the silicon substrate and the epitaxial layer.

8 Claims, 6 Drawing Sheets

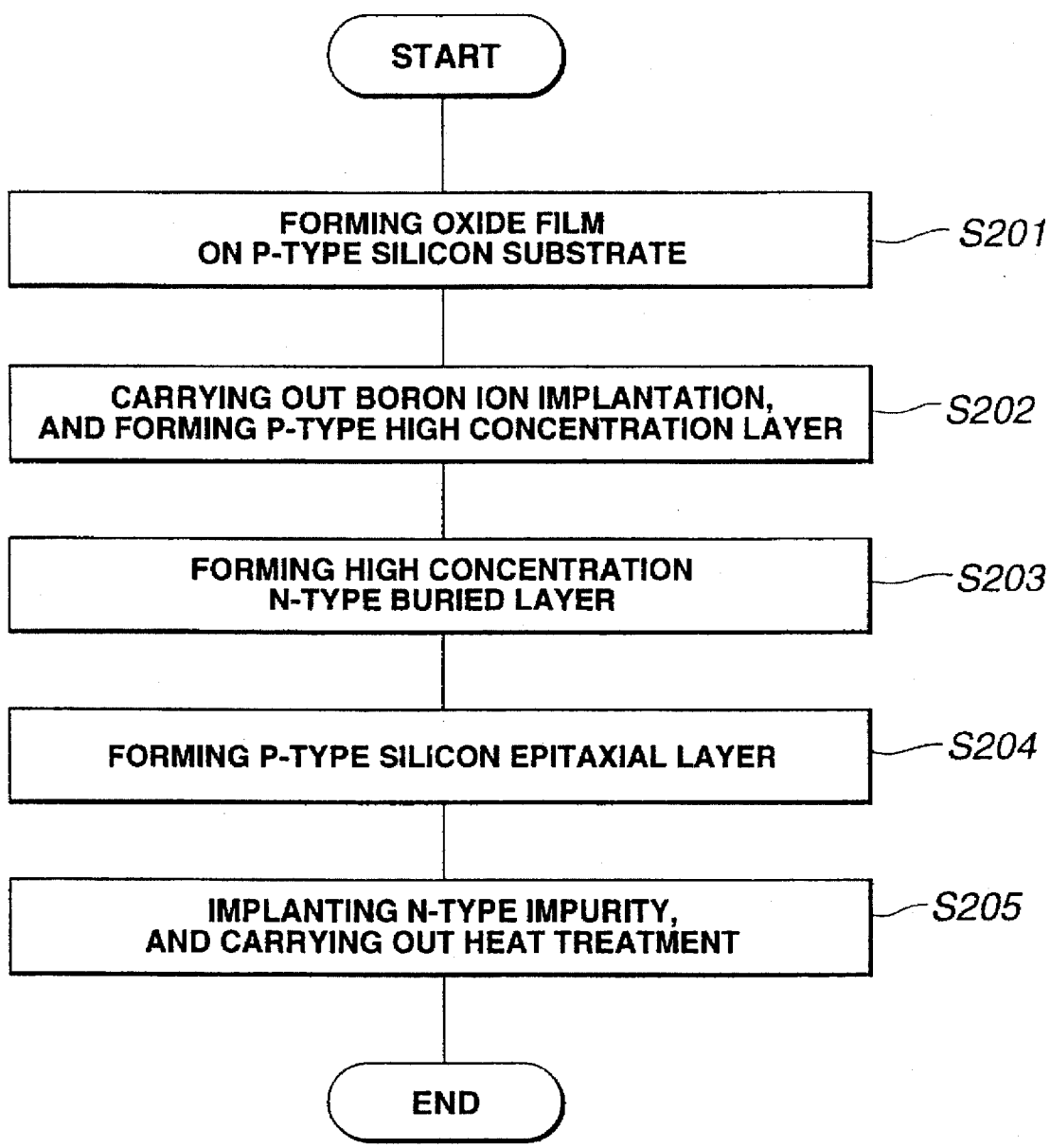

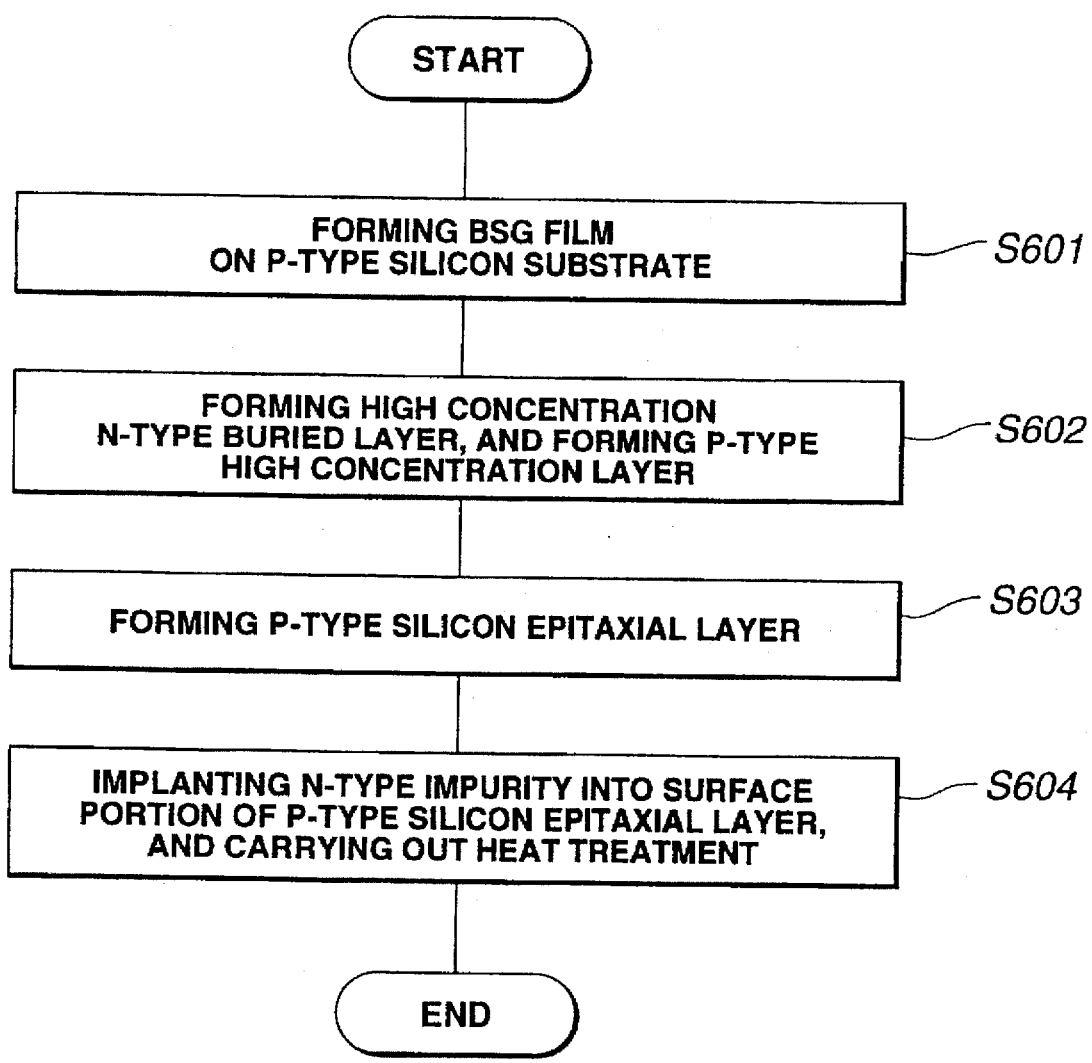

METHOD OF PRODUCING SEMICONDUCTOR DEVICE WITH A BURIED LAYER

This application is a continuation of application Ser. No. 08/253,026 filed Jun. 2, 1994, now abandoned.

BACKGROUND OF THE INVENTION

1. Field of the Invention

This invention relates to improvements in a method of producing a semiconductor device, and more particularly to a semiconductor device producing method in which an inversion layer is prevented from being formed at the boundary between a silicon substrate and an epitaxial layer even under occurrence of autodoping.

2. Description of the Prior Art

A variety of producing methods for semiconductor devices have been proposed and put into practical use. A typical one of them will be discussed hereinafter. In this producing method, first an oxide film having a thickness of about 9000 A is formed on a P-type silicon base. The oxide film corresponding to a region in which a high concentration N-type buried layer is to be formed is partly removed by a mask-etching. An oxidation film having a thickness ranging from 1000 to 2000 A is formed on the buried layer of the silicon base, and removed. The P-type silicon base has a low impurity concentration of $10^{14}$ to $10^{15}/cm^3$.

Then, the high concentration N-type buried layer is formed on the silicon substrate by ion implantation, solid diffusion or the like. The high concentration N-type buried layer has a high concentration of $10^{18}$ to $10^{20}/cm^3$. After the high concentration N-type buried layer has been formed, whole the oxidation film is removed to form a P-type silicon epitaxial layer on the P-type silicon substrate. The epitaxial layer is formed, for example, by a chemical vapor deposition (CVD) in which silicon chloride ($SiH_2Cl_2$ or $SiHCl_3$) or a compound of silicon and hydrogen ($SiH_4$) is reacted with the surface of the P-type silicon substrate upon heating the P-type silicon substrate at a high temperature ranging from 1000° to 1200° C. The P-type silicon epitaxial layer is formed to have a low impurity concentration similar to that in the P-type silicon substrate in order to obtain a sufficient breakdown voltage to a N-type well which will be formed after.

N-type impurity is implanted in the P-type silicon epitaxial layer over the high concentration N-type buried layer by using an ion implantation. Then, a heat treatment is made on the thus implanted P-type silicon epitaxial layer, in which N-type wells are formed under the diffusion from the high concentration N-type buried layer and from the top surface. A transistor is to be formed in each N-type well. Thus, a well can be relatively readily formed by using diffusion from the high concentration N-type buried layer even in case the P-type silicon epitaxial layer has a high thickness of 10 to 20 μm or higher.

However, drawbacks have been encountered in the above-discussed conventional producing method of a semiconductor device, in which leak is produced among the N-type wells under the action of lateral autodoping occurring at the step of formation of the epitaxial layer. Meant by the lateral autodoping is a phenomena in which the impurity in the buried layer is taken into the epitaxial layer. More specifically, when P-type epitaxial layer is being formed in the above-discussed producing method, the impurity in the high concentration N-type buried layer evaporates under the action of heat produced by heating the P-type silicon substrate. The impurity evaporated from the high concentration N-type buried layer is taken in a boundary face between the P-type silicon substrate and the P-type epitaxial layer thereby forming a N-type inversion layer. This autodoping depends on the temperature of the epitaxial layer, reacted gas and the like. In order to prevent this autodoping, a low temperature epitaxial growth method, a reduced pressure vapor epitaxial growth method and the like have been proposed. However, these methods have been confirmed to be unsuitable for production of a semiconductor device having a relatively thick (10 to 21 μm) epitaxial layer because the growth rate of epitaxial layer is considerably low in these methods.

SUMMARY OF THE INVENTION

It is an object of the present invention to provide an improved method of producing a semiconductor device, which can effectively overcome the drawbacks encountered in conventional producing methods of a semiconductor device.

Another object of the present invention is to provide an improved method of producing a semiconductor device, in which leak current made between wells in the semiconductor owing to autodoping can be effectively prevented.

A further object of the present invention is to provide an improved method of producing a semiconductor device, in which an inversion layer is prevented from being formed between a silicon substrate and an epitaxial layer even if autodoping occurs during formation of the epitaxial layer.

According to the present invention, a method of producing a semiconductor device comprises: forming a high concentration first characteristic buried layer in a surface portion of a silicon substrate; forming a second characteristic high concentration layer in the surface portion of the silicon substrate in a first region other than a second region in which the high concentration characteristic buried layer is to be formed; and forming a second characteristic epitaxial layer at least on the buried layer.

By virtue of the high concentration layer formed in the region in which no buried layer is formed, impurity from the buried layer is effectively offset thereby preventing an inversion layer (due to autodoping) from being formed at the boundary between the silicon substrate and the epitaxial layer, thereby preventing leak between wells to be formed in the epitaxial layer.

BRIEF DESCRIPTION OF THE DRAWINGS

In the drawings, like reference numerals designate like elements and parts throughout all the figures, in which:

FIGS. 2 is a flowchart showing the producing method of the example of FIGS. 1A to 1E;

FIG. 6 is a flowchart showing the producing method of the example of FIGS. 5A to 5D;

DETAILED DESCRIPTION OF THE INVENTION

Referring now to FIGS. 1A to 1E and 2, an example of a method of producing a semiconductor device, according to the present invention, will be discussed in detail.

Figure 1A:
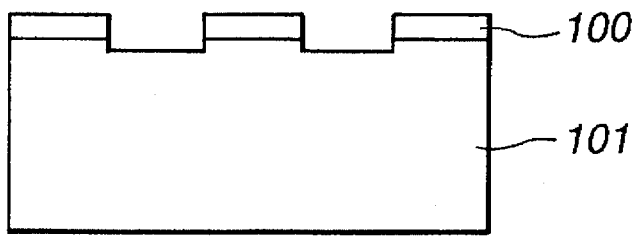
FIGS. 1A to 1E are explanatory schematic sectional views illustrating an example of a method of producing a semiconductor device, in accordance with the present invention.

As shown in FIG. 1A, first an oxide film 100 having a thickness of about 9000 A is formed on a P-type silicon substrate 101 as indicated at a step S201 in FIG. 2. The P-type silicon substrate 101 has a low impurity concentration of $10^{14}$ to $10^{15}$/cm$^3$. The oxide film 100 is partly removed in its region in which a high concentration buried layer 105 is to be formed, by a mask-etching, thereby forming a structure S. Then, an oxide film 103 having a thickness ranging from 1000 to 2000 A is further formed on the whole (top) surface of the structure S.

Figure 1B:
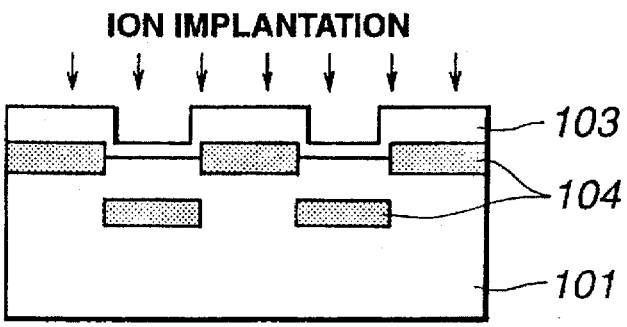
Figure 1C:
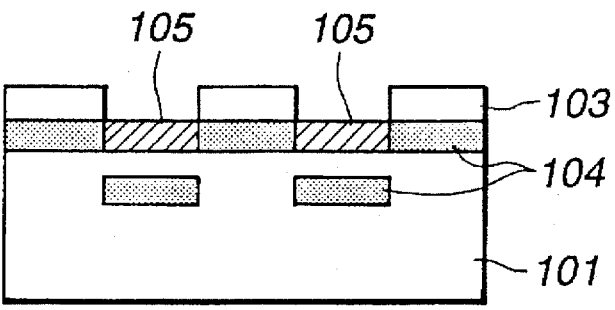
Figure 1D:
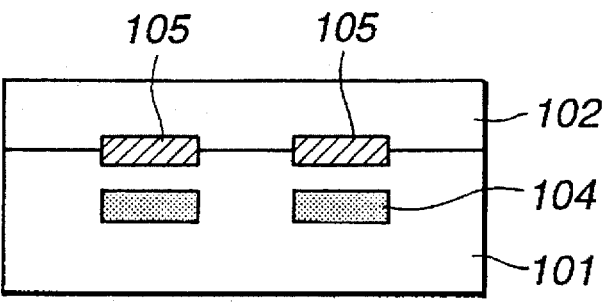

Thereafter, as shown in FIG. 1B, ion implantation of boron is made on the whole (top) surface of the structure S thereby forming P-type high concentration layers 104 at a surface portion of the silicon substrate 101 as indicated at a step S202 in FIG. 2. At this time, energy for the ion implantation is set at such a high level that the P-type high concentration layer 104 is formed at the boundary section between the thick part of the oxide layer and the P-type silicon substrate 101. Next, as shown in FIG. 1C, the high concentration N-type buried layer 105 is formed in the surface portion of the silicon substrate 101, for example, by ion implantation, solid diffusion or the like as indicated at a step S203 in FIG. 2. The high concentration N-type buried layer 105 has a high impurity concentration of $10^{18}$ to $10^{20}$/cm$^3$. Furthermore, as shown in FIG. 1D, after formation of the high concentration N-type buried layer 105, the oxide film 103 is removed, then a P-type silicon epitaxial layer 102 is formed by a CVD (chemical vapor deposition) as indicated at a step S204 in FIG. 2. The P-type silicon epitaxial layer 102 has a low impurity concentration similar to that of the P-type silicon substrate 101.

Figure 1E:
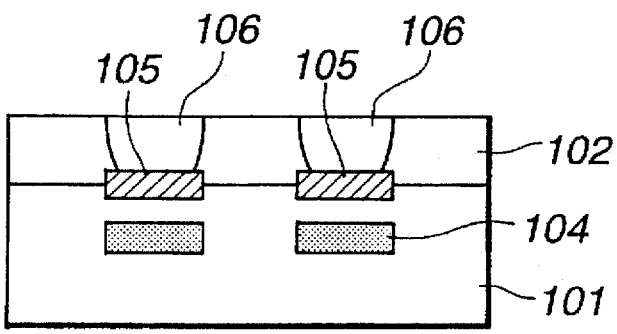

Subsequently, as shown in FIG. 1E, N-type impurity is implanted into the surface of the P-type silicon epitaxial layer 102 over the high concentration N-type buried layers 105 by an ion implantation, and a heat treatment is made on the thus ion-implanted P-type silicon epitaxial layer 102 as indicated at a step S205 in FIG. 2. At this time, N-type wells 106 are formed under impurity diffusion from the high concentration N-type buried layer 105 and from the top surface of the P-type silicon epitaxial layer 102. A transistor is to be formed in each N-type well 106. Thus, a semiconductor device D is produced. In this example, the P-type epitaxial layer 102 has a relatively high thickness of 10 to 21 μm or higher.

As discussed above, according to the producing method of the present invention, the P-type ion implantation is made before the step of formation of the P-type silicon epitaxial layer 102, in which boron is supplied to a deep portion in the region of the high concentration N-type buried layer 105 while the P-type high concentration layer 104 is formed at the surface portion of the silicon substrate 101 in the region in which the high concentration N-type buried layer 105 is not to be formed. As a result, even if lateral autodoping occurs during the step of formation of the epitaxial layer, the impurity from the high concentration N-type buried layer 105 is offset with the P-type high concentration layer 104 formed at the surface of the silicon substrate 101, thereby preventing a N-type inversion layer from being formed at the boundrary between the silicon substrate 101 and the epitaxial layer 102.

FIGS. 3A to 3E and 4 illustrate another example of the method of producing the semiconductor device in accordance with the present invention, which is similar to the example of FIGS. 1A to 1E and 2.

Figure 3A:
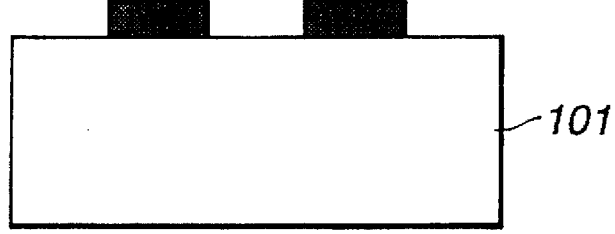
FIGS. 3A to 3E are explanatory schematic sectional views illustrating another example of the semiconductor device producing method in accordance with the present invention.

In the semiconductor device producing method of this example, first as shown in FIG. 3A, a PSG (phosphosilicate glass) film containing N-type impurity is formed on a P-type silicon substrate 101 as indicated at a step S401. The PSG film 301 is partly removed in a region in which the high concentration buried layer 105 is not formed, by the masketching, thus obtaining a structure S shown in 3A. An oxide film 103 having a thickness ranging from 1000 to 2000 A is formed on the whole the (top) surface of the structure S.

Figure 3B:
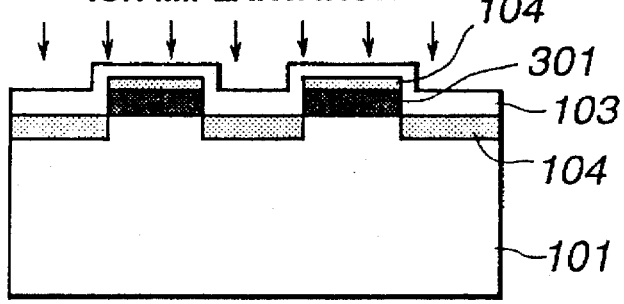
Figure 3C:
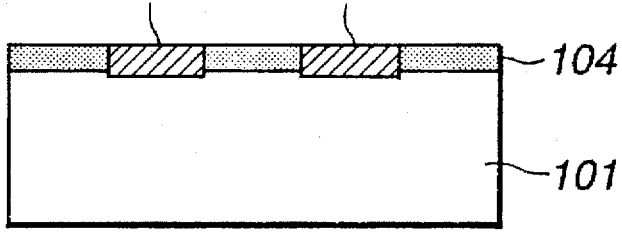
Figure 3D:
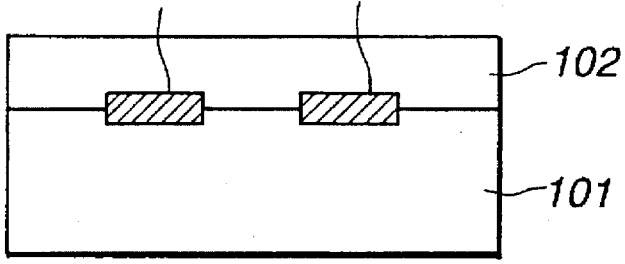
Figure 4:
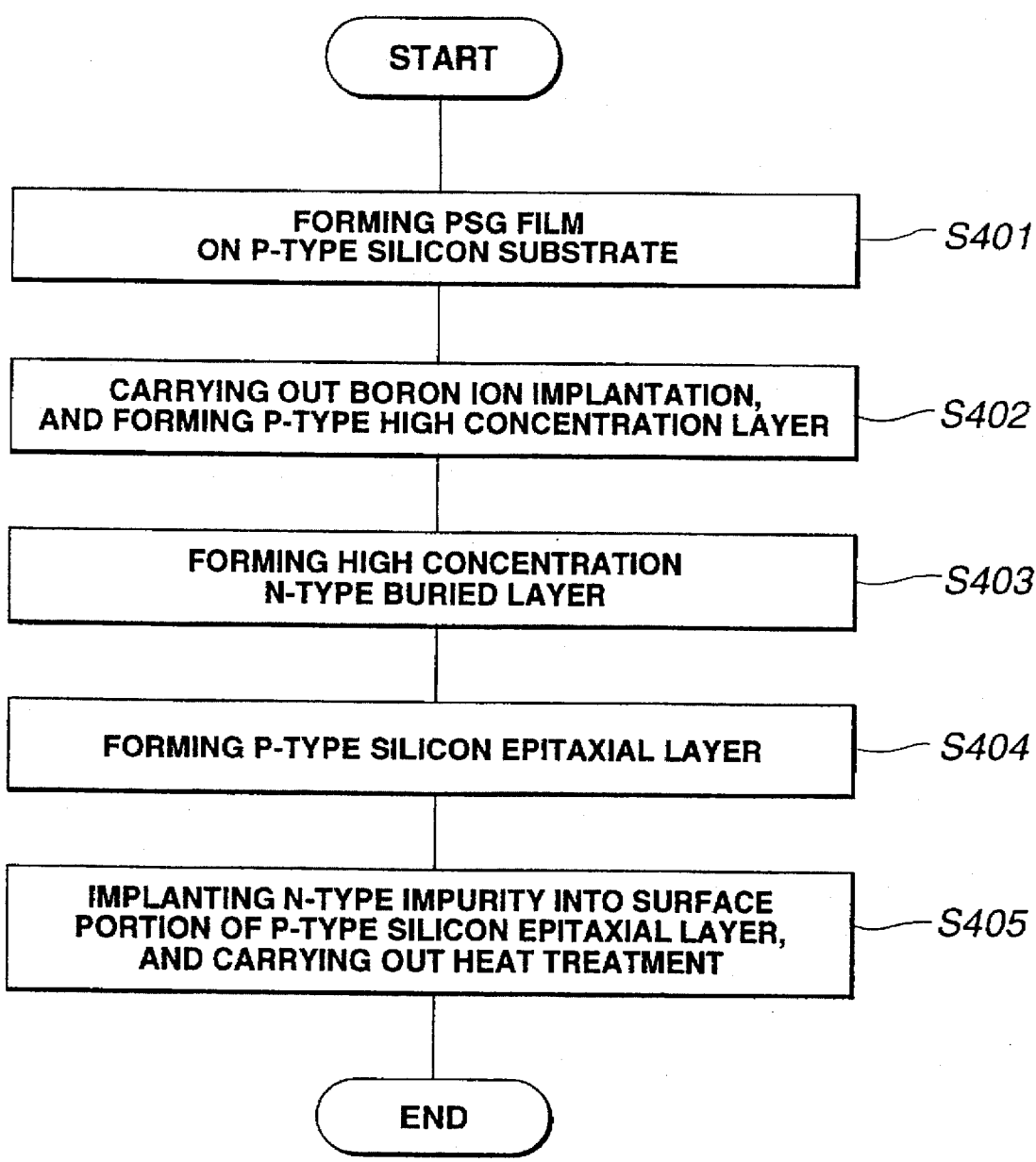
FIG. 4 is a flowchart showing the producing method of the example of FIGS. 3A to 3E.

Then, as shown in FIG. 3B, boron ion implantation is made on the whole (top) surface of the structure S covered with the oxide film 103, thereby forming a P-type high concentration layer 104 as indicated at a step S402 in FIG. 4. Thereafter, as shown in FIG. 3C, the structure S is subjected to a heat treatment in which N-type impurity is diffused from the PSG film 301 into the P-type silicon substrate 101 thereby forming a high concentration N-type buried layer 105 as indicated at a step S403. Then, the unnecessary PSG film 301 is removed. Subsequently, as shown in FIG. 3D, after formation of the high concentration N-type buried layer 105, a P-type silicon epitaxial layer 102 is formed by the CVD as indicated at a step S404 in FIG. 4.

Figure 3E:
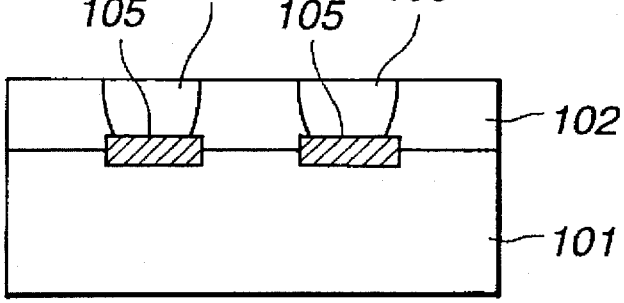

Thereafter, as shown in FIG. 3E, N-type impurity is implanted into the P-type silicon epitaxial layer 102 at parts over the high concentration N-type buried layer, and then the thus implanted structure S is subjected to a heat treatment as indicated at a step S405 in FIG. 4. At this time, N-type wells 106 are formed under impurity diffusion from the high concentration N-type buried layer 105 and from the (top) surface of the epitaxial layer 102. A transistor is to be formed in each N-type well. Thus, a simiconductor device D is produced.

As discussed above, according to the producing method of this example, P-type ion implantation is carried out using the PSG film as a mask, so that the P-type high concentration layer 104 is formed partly on the silicon substrate 101 in the region in which the high concentration N-type buried layer 105 is not to be formed. As a result, even if lateral autodoping occurs during formation of the epitaxial layer, the impurity from the high concentration N-type buried layer 105 is compensated with the P-type high concentration layer 104 formed at the surface of the silicon substrate 101, so that no N-type inversion layer is formed.

FIGS. 5A to 5D and 6 illustrate a further example of the method of producing a semiconductor device, in accordance with the present invention, which is similar to the example of FIGS. 1A to 1E and 2.

Figure 5A:
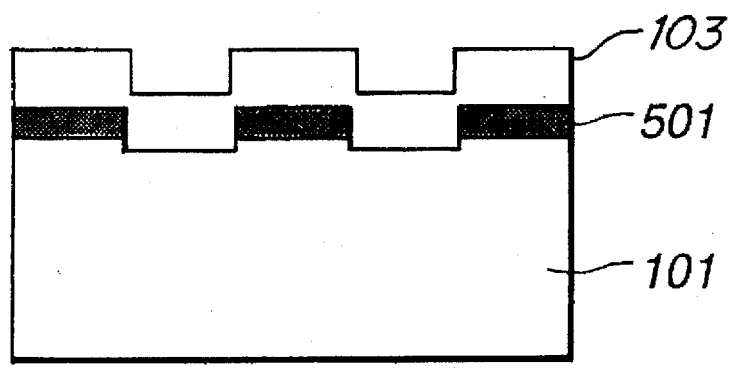
FIGS. 5A to 5D are explanatory schematic sectional views illustrating a further example of the semiconductor device producing method in accordance with the present invention.

In the semiconductor device producing method of this example, first as shown in FIG. 5A, a BSG (borosilicate glass) film 301 containing P-type impurity is formed on a P-type silicon substrate 101 as indicated at a step S601 in FIG. 6. The BSG film 501 is partly removed in a region in which the high concentration N-type buried layer 105 is to be formed, by a mask-etching, thereby obtaining a structure S. An oxide film 103 having a thickness ranging from 1000 to 2000 A is formed on the whole (top) surface of the structure S.

Figure 5B:
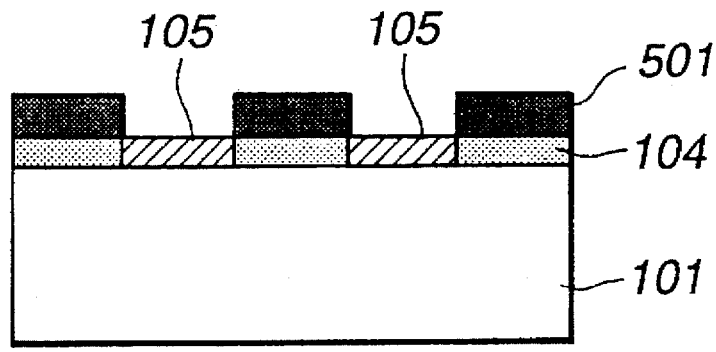
Figure 5C:
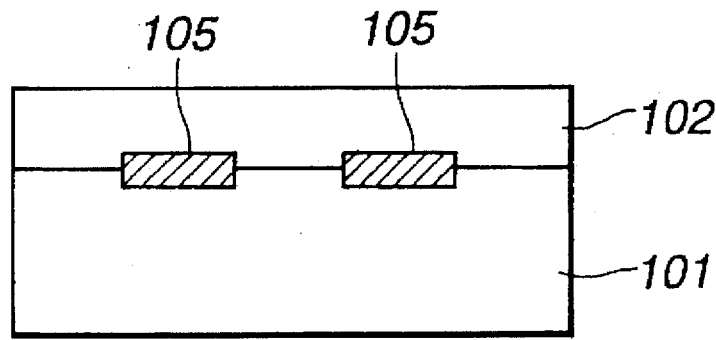

Then, as shown in FIG. 5B, a high concentration N-type buried layer 105 is formed. At this time, P-type impurity is diffused from the BSG film 501 to the P-type silicon substrate 101 thereby forming a P-type high concentration layer 104 in a region other than the high concentration N-type buried layer 105 as indicated at a step S602. Then, as shown in FIG. 5C, after formation of the high concentration N-type buried layer 105, the BSG film 501 is removed, and then a P-type silicon epitaxial layer 102 is formed by the CVD as indicated at a step S603 in FIG. 6.

Figure 5D:
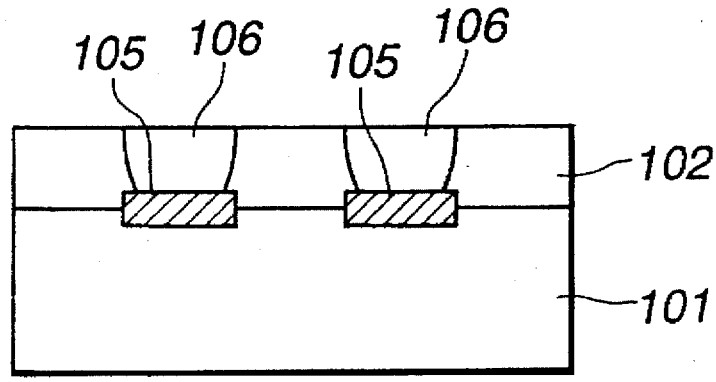

Subsequently, as shown in FIG. 5D, N-type impurity is implanted into the P-type silicon epitaxial layer 102 at parts over the high concentration N-type buried layer 105 by using the ion implantation, and then the thus implanted structure S is subjected to a heat treatment as indicated at a step S604. At this time, impurity diffusion is made from the high concentration N-type buried layer 105 and from the (top) surface of the epitaxial layer 102, thereby forming N-type wells 106. A transistor is to be formed in each well 106. Thus, a semiconductor device D is produced.

As discussed above, according to the semiconductor device producing method of this example, the BSG film serving as a P-type impurity diffusion source is used as a mask during the step of forming the high concentration N-type buried layer, so that the P-type high concentration layer 104 is formed in a region in which the high concentration N-type buried layer 105 is not to be formed. As a result, even if lateral autodoping occurs during the step of forming the epitaxial layer, impurity from the high concentration buried layer 105 is offset with the P-type high concentration layer 104 so that no N-type inversion layer is formed.

As appreciated from the above, according to the semiconductor device producing method of the present invention, the P-type high concentration layer 104 is formed at the surface of the silicon substrate in the region in which the N-type buried layer is not to be formed, before formation of the P-type silicon epitaxial layer. Accordingly, even if autodoping occurs during deposition of the epitaxial layer, no N-type layer (inversion layer) is formed thereby preventing leak. Additionally, the P-type high concentration layer and N-type buried layer are formed in self-alignment by using a single mask, and therefore the production of the semiconductor device is largely facilitated.

While the high concentration layer 104 and the high concentration buried layer 105 have been shown and described as being of P-type and N-type, respectively, in the examples, it will be understood that the layer 104 and the layer 105 may be of N-type and P-type, respectively.

What is claimed is:

1. A method of producing a semiconductor device, comprising:
   forming a mask on a silicon substrate, said mask having a first area of opening and a second area other than said first area;
   forming a high concentration first conductivity type buried layer on the silicon substrate;
   forming a second conductivity type high concentration layer by ion implantation on a surface of said silicon substrate in a first region other than a second region in which said high concentration first conductivity type buried layer is to be formed, the ion implantation being made through said second area of said mask to reach the first region located under said mask;
   removing said mask;
   forming a second conductivity type epitaxial layer at least on said buried layer; and
   forming a first conductivity type well in said epitaxial layer to reach said first conductivity type buried layer.

2. A method as claimed in claim 1, wherein said second conductivity type high concentration layer and said first conductivity type buried layer are formed in self-alignment.

3. A method as claimed in claim 1, wherein said second conductivity type high concentration layer forming step is carried out before the second conductivity type epitaxial layer forming step.

4. A method as claimed in claim 1, wherein said high concentration first conductivity type buried layer and said second conductivity type high concentration layer are formed adjacent and generally aligned in level with each other.

5. A method as claimed in claim 1, wherein the first conductivity type is N-type, and the second conductivity type is P-type.

6. A method as claimed in claim 1, wherein the first conductivity type is P-type, and the second conductivity type is N-type.

7. A method as claimed in claim 1, wherein the step of forming said high concentration first conductivity type buried layer is carried out after the step of forming said second conductivity type high concentration layer.

8. A method of producing a semiconductor device, comprising:
   forming a mask on a second conductivity type silicon substrate, said mask having a first area of opening and a second area other than said first area;
   forming a high concentration first conductivity type buried layer on the silicon substrate by ion implantation on a surface of said silicon substrate through said first area of said mask;
   forming a second conductivity type high concentration layer by ion implantation on a surface of said silicon substrate in a first region other than a second region in which said high concentration first conductivity type buried layer is to be formed, the ion implantation being made through said second area of said mask to reach the first region located under said mask;
   removing said mask;
   forming a second conductivity type epitaxial layer at least on said buried layer; and
   forming a first conductivity type well in said epitaxial layer to reach said first conductivity type buried layer.

* * * * *